United States Patent [19]
Kakizaki et al.

[11] Patent Number: 5,445,271
[45] Date of Patent: Aug. 29, 1995

[54] RESIN-MADE BASKET FOR THIN SHEETS

[75] Inventors: Takeyoshi Kakizaki; Kenji Ikeda; Tetsuya Shiozaki, all of Tokyo, Japan

[73] Assignee: Kabushiki Kaisha Kakizaki Seisakusho, Tokyo, Japan

[21] Appl. No.: 244,752
[22] PCT Filed: Nov. 16, 1993
[86] PCT No.: PCT/JP93/01674
  § 371 Date: Jun. 9, 1994
  § 102(e) Date: Jun. 9, 1994
[87] PCT Pub. No.: WO94/11274
  PCT Pub. Date: May 26, 1994

[30] Foreign Application Priority Data

Nov. 17, 1992 [JP] Japan .................. 4-307088

[51] Int. Cl.$^6$ ............................. B65D 73/00
[52] U.S. Cl. ................................ 206/459.5
[58] Field of Search .......... 206/459.5, 334, 454, 206/328

[56] References Cited

U.S. PATENT DOCUMENTS

| | | | |
|---|---|---|---|
| 4,061,228 | 12/1977 | Johnson | 206/454 |
| 4,129,211 | 12/1978 | Clement et al. | 206/453 |
| 4,603,809 | 8/1986 | Vilotte et al. | 206/459.5 |
| 4,684,021 | 8/1987 | Niebling et al. | 206/334 |
| 4,721,207 | 11/1988 | Kikuchi | 206/444 |
| 4,805,772 | 2/1989 | Shaw et al. | 206/459.5 |
| 4,825,093 | 4/1989 | Kiriseko et al. | . |
| 4,850,488 | 7/1989 | Humbert | 206/459.5 |
| 4,896,034 | 1/1990 | Kiriseko | . |
| 4,946,034 | 8/1990 | Matsubara | 206/459.5 |
| 4,983,815 | 1/1991 | Kumasaka | . |
| 5,051,870 | 9/1991 | Companion | 206/459.5 |
| 5,143,217 | 9/1992 | Igarashi | 206/459.5 |
| 5,161,687 | 11/1992 | Kornell et al. | 206/459.5 |
| 5,205,178 | 4/1993 | Odernheimer | . |
| 5,216,925 | 6/1993 | Odernheimer | . |
| 5,238,307 | 8/1993 | Mooney et al. | 206/459.5 |
| 5,252,816 | 10/1993 | Onimaru et al. | . |
| 5,255,797 | 10/1993 | Kos | 206/454 |

FOREIGN PATENT DOCUMENTS

| | | |
|---|---|---|
| 56-69917 | 4/1984 | Japan . |
| 59-69917 | 4/1984 | Japan . |
| 59-175751 | 10/1984 | Japan . |
| 61-11771 | 4/1986 | Japan . |
| 62-146788 | 9/1987 | Japan . |
| 62-59663 | 12/1987 | Japan . |
| 2-47314 | 10/1990 | Japan . |

Primary Examiner—David T. Fidei
Attorney, Agent, or Firm—Oliff & Berridge

[57] ABSTRACT

A wafer carrier box contains a wafer carrier which holds at the same time, a plurality of thin sheets, such as magnetic disks, compact disks, silicon wafers for producing semiconductors, or glass bases for LCDs, for operations including conveying, storing and surface-processing the thin sheets. On wall surfaces of the wafer carrier box and/or wafer carrier are bar codes including processing histories and control directly written by a laser beam. The wafer carrier is formed of a material such as polypropylene containing 0.0001 to 0.5 percent by weight of Si or other material that acts as an exothermic body. The other material may be a catalytic substance normally included in production of the wafer carrier. Deterioration in identification capability, which may occur due to chemical liquids, is eliminated. Therefore damage to the bar code which provides lot identification is prevented and improved processing is achieved.

13 Claims, 2 Drawing Sheets

RESIN-MADE BASKET FOR THIN SHEETS

FIELD OF THE INVENTION

The present invention relates to a resin-made basket for thin sheets in which a plurality of thin sheets (that is, base members such as hard memory disks (magnetic disks) or compact disks (CDs), silicon wafers for producing semiconductors, or glass bases for LCD, etc.) are contained and held to be conveyed, stored, surface-treated, etc. at the same time.

DESCRIPTION OF RELATED ART

It is usual that thin sheets such as silicon wafers or compact disks are contained in a resin-made basket for thin sheets (for example, an wafer carrier) for dealing with them. The resin-made basket for thin sheets will contain and hold a plurality of thin sheets placed therein in parallel to each other at certain intervals, so that these thin plates are dealt with together.

In cases where a large quantity of thin sheets are dealt with, a large number of baskets each containing a plurality of thin sheets are used for performing conveyance, storage, surface treatment, etc. of the thin sheets with each basket being one unit. Besides being processed in a dry state, the thin sheets are processed in an wet state in which they are processed as being washed with pure water or immersed in chemical liquids. Processing in the wet state requires the basket to be immersed in pure water or chemical liquids together with the thin sheets.

On one hand, each basket requires that a bar code be put on the basket to record a history of each process (processing histories) and/or control. There have been provided as follows several means for putting the bar code on the basket.

(1) With a bar code printed on a piece of paper, the piece of paper is directly applied on the basket.
(2) With a bar code printed on a piece of paper, the piece of paper is applied on the basket by sealing with resin film.
(3) With a bar code baked on a ceramic plate, the ceramic plate is mounted on the basket.

However, the above means for putting the bar code have a wide variety of drawbacks as follows.

In cases where a piece of paper, on which a bar code is printed, is directly applied or is applied by sealing with resin film on the basket, there is a possibility that the applied piece of paper showing a bar code will come away to fail in identification of the basket. Further, washing by liquids such as pure water, carried out before putting the basket into a processing line, might cause printing ink to come out because of the washing liquids or cause the washing liquids to permeate into a space between the paper and resin film, both of which lead to a poor reading of the bar code.

In some cases, the basket is immersed in chemical liquids in the course of a processing line; in this immersion, the piece of paper showing a bar code is once removed from the basket and will be again applied after completion of the immersion in chemical liquids. Such a manner of operation, however, might cause mistakes in recognition of lots in case a large quantity of baskets are processed.

Incidentally, in case the ceramic plate on which a bar code is baked is mounted on the basket, the ceramic plate is liable to break due to lack of flexibility and weakness for shocks.

The present invention has been done with taking the above-mentioned problems into consideration, and its object is to provide a resin-made basket for thin sheets wherein operations including processing for thin sheets are improved by using a bar code which eliminates deterioration in identification capability because of pure water, chemical liquids, etc., mistakes in lot recognition, and other sources of damage.

SUMMARY OF THE INVENTION

The present invention is characterized in a resin-made basket for thin sheets, in which a plurality of thin sheets are contained for operations including conveying, storing, and processing the thin sheets, a bar code for processing histories and control being directly written on a wall surface of the basket by a laser beam. This prevents discoloration of signs and burring in shades even when being immersed in pure water, chemical liquids, etc., so that is degradation in identification capability resulting from being unreadable is avoided. Further, there is no need for removing a bar code which might result in mistakes in recognition of lots and no damage. This enhances smooth processing of thin sheets.

Further, a basket body on which said bar code is written in by said laser beam is formed of any one of polypropelene (PP), polybutylene telephtalate(PBT), polycarbonate(PC), polyetherimide(PEI), polyetheretherketone(PEEK), and polyester elastomer each containing 0.0001 to 0.5 percent by weight of any one of Si, Ca, Ba, Na, K, C, Ti, Al and Mg as an exothermic body. Such inclusion of the exothermic body such as Si etc. into the basket body enables the exothermic body to heat in response to radiation of a laser beam, and resin material around the high-temperature exothermic body expands and carbonize to form black and white shades. This enables the bar code to be written. In this case, including 0.0001 to 0.5 percent by weight of the exothermic body permits the bar code to be written more efficiently and steadily.

Still further, the basket body may be formed of any one of polypropelene (PP), polybutylene telephtalate (PBT), polycarbonate (PC), polyetherimide (PEI), polyetheretherketone (PEEK), and polyester elastomer each containing only catalytic substance whose mixing is unavoidable in production. The catalytic substance functions also as an exothermic body, and utilizing this enables the writing of the bar code.

In this invention, a resin-made basket for thin sheets includes a case directly containing and holding a plurality of thin sheets for operations such as conveyance and a container containing the case in which the plurality of thin sheets are directly held. Therefore, the bar code, written in by a laser beam, may be positioned on wall surface of the case directly holding the thin sheets and/or on a wall surface of the container containing the case.

DETAILED DESCRIPTION OF THE PREFERRED EMBODIMENTS

One embodiment of the present invention will now be described with reference to drawings.

Figure 1:
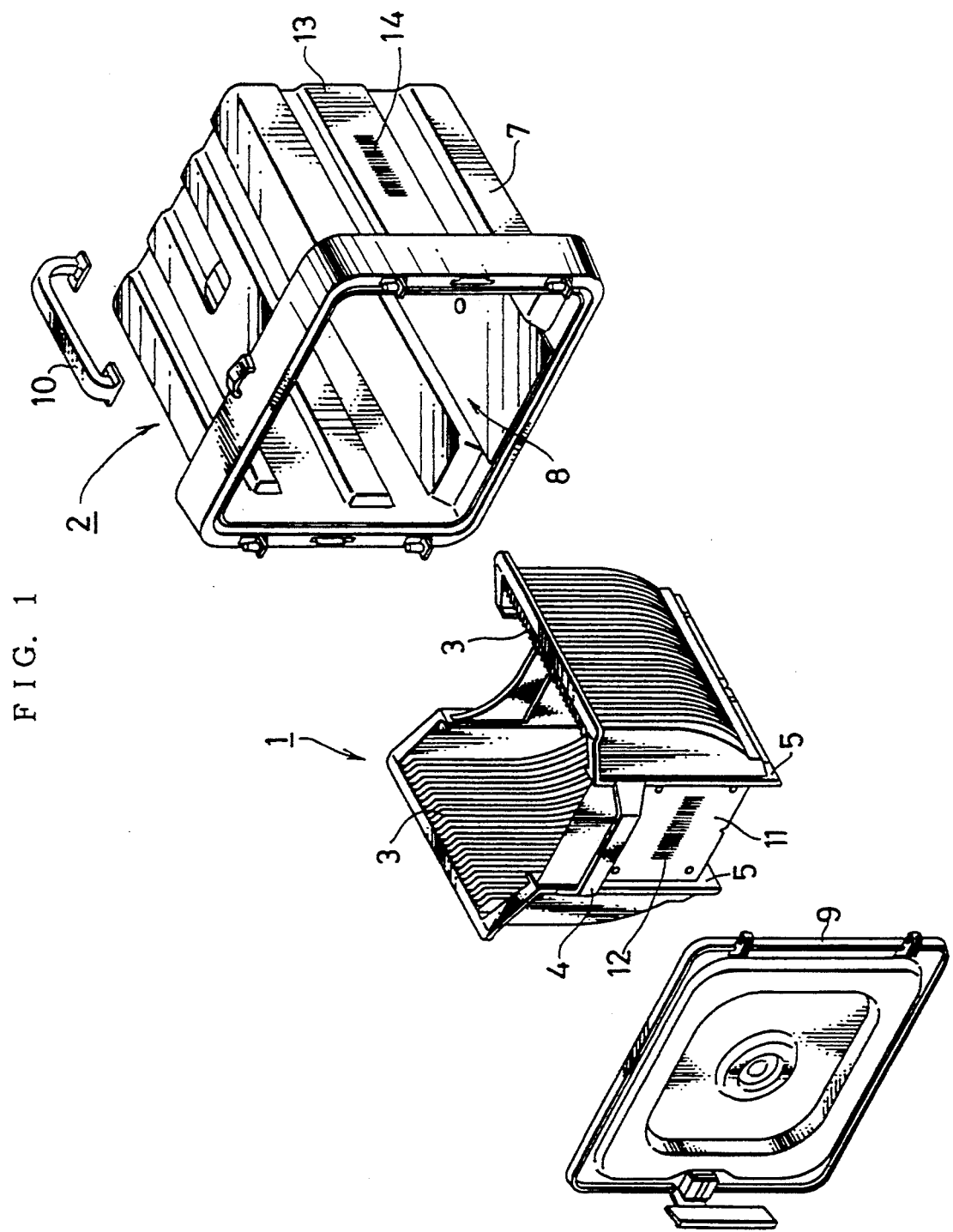
FIG. 1 is a disassembled perspective view showing a wafer carrier and a wafer carrier box as a resin-made basket for thin sheets according to the present invention.
Figure 2:
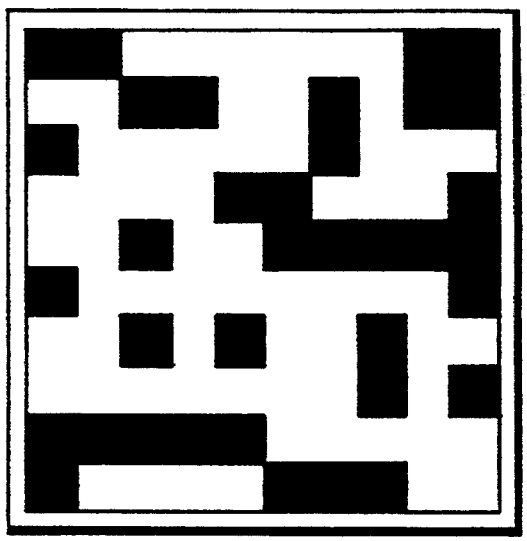
FIG. 2 is a plane view showing one example of a two-dimensional bar code.

A resin-made basket for thin sheets, as above-explained, is used for holding thin sheets including base members such as hard memory disks (magnetic disks) or compact disks (CDs), silicone wafers for producing semiconductors, and glass bases for LCD. Based on FIG. 1, the present embodiment will refer to a case where selected from them are silicone wafers for producing semiconductors, and used are an wafer carrier for directly holding the silicone wafers and an wafer carrier box for containing and holding the wafer carrier. "A resin-made basket for thin-sheets" used hereinafter is a concept including both the wafer carrier and wafer carrier box.

With containing and holding a plurality of wafers (not shown), the wafer carrier 1 is admitted to a processing line for wafers contained in the wafer carrier box 2 to be conveyed, stored, etc. The wafer carrier 1, which is formed into a basket shape having an opening at its upper side, is designed to have a plurality of supporting plate portions 3 arranged in parallel to each other at intervals of a certain distance within the wafer carrier 1, so that a plurality of wafers are held at certain intervals in parallel to each other. In the figure, a reference numeral 4 represents a knob and a reference numeral 5 represents a leg portion formed into two in number under the wafer carrier 1.

The wafer carrier box 2 is opened at its one side and consists primarily of a housing 7 containing the wafer carrier 1 and a lid member 9 covering an opening 8 of the housing 7. On the upper side of the wafer carrier box 2, a knob 10 is detachably attached for carrying this box 2.

Further, on a side wall of the wafer carrier 1, there is applied a bar code 12 as an identification sign for processing histories and control of surface processing etc. of wafers. The bar code 12 is read out by a bar code reader (not shown) disposed in a processing line of wafers, information provided from the bar code 12 being used for following operations involving processes, conveyance, or storage.

On a side wall 13 of the wafer carrier box 2, there is also applied a bar code 14 which is the same as the bar code 12 applied on the side wall 11 of the wafer carrier 1. This bar code 14 contains the same information as the bar code 12 as well as inherent information as to conveying and storing the box 2.

Next described are materials of the wafer carrier 1 and wafer carrier box 2 and a manner by which the bar codes 12 and 14 are applied by a laser beam onto the wafer carrier 1 and wafer carrier box 2.

Materials used for the wafer carrier 1 and wafer carrier box 2 include polypropylene (PP), polybutylene telephtalate (PBT), polycarbonate(PC), polyetherimide(PEI), polyetheretherketone(PEEK) or polyester elastomer. Such materials as polypropylene contain 0.0001 to 0.5 percent by weight, preferably 0.03 to 0.5 percent by weight, of Si, Ca, Ba, Na, K, C, Ti, Al or Mg, as an exothermic body.

The bar codes 12 and 14 are written by a laser system on the side wall 11 of the wafer carrier 1 and the side wall 13 of the wafer carrier box 2 made of polypropylene and the like..

Radiation conditions of a laser beam are as follows.

(1) Type of laser: nd: YAG laser
(2) Wavelength of laser: 1.06 μm
(3) Printing speed: 400 μm/sec to 100 mm/sec
(4) Capacity of laser (Output): 30 W (Max.)

The radiation of a laser beam in such manner permits the laser beam to be absorbed into the exothermic bodies, thus the exothermic bodies heating, This heating causes resin around the exothermic bodies to expand and carbonize, so that black and white shades are formed. Such manner has been used for writing in the bar codes 12 and 14; it has been possible that lines of min. 0.1 mm width can be written at intervals of min. 0.2 mm and they can be read by a bar code reader.

Incidentally, among Si, Ca, Ba, Na, K, C, Ti, Al or Mg used as the exothermic body, it is possible to use one of them or to use two or more of them. A preferable inclusion rate of the exothermic body is 0.5 percent for polypropelene or 0.03 percent for polybutylene telephtalate.

Further, another writing of the bar codes 12 and 14 has been tried using the aforementioned laser beam, in which the wafer carrier 1 has been formed of materials such as polypropelene (PP), polybutylene telephtalate(PBT), polycarbonate(PC), polyetherimide(PEI), polyetheretherketone(PEEK) or polyester elastomer, all of which do not contain an exothermic body. Production of polypropylene (PP) and the like will introduce a mixing of Al or Mg, amounting approximately 20 to 30 ppm, used as catalytic substance. Mixing of this catalytic substance is unavoidable in production. Since this catalytic substance, however, functions as an exothermic body, the mixed catalytic substance can be utilized without including another new exothermic body.

In this case, radiation conditions of the laser beam is the same as the above in which the exothermic body is included, and are as follows.

(1) Type of laser: nd: YAG laser
(2) Wavelength of laser: 1.06 μm
(3) Printing speed: 400 μm/sec to 100 mm/sec
(4) Capacity of laser (Output): 30 W (Max.)

Writing the bar codes 12 and 14 with a laser beam according to the above manner has resulted in that it was possible to write in lines of min. 0.1 mm width at intervals of min. 0.2 mm and to read them by a bar code reader.

The bar codes 12 and 14 will be written, as identifying signs, on each wafer carrier 1 and each wafer carrier box 2 at the final stage in the production line of the wafer carrier 1 and wafer carrier box 2 in mass production.

The wafer carrier 1 thus-constructed is washed with pure water prior to being placed into a processing line of wafers. In the processing line, the wafer carrier 1 is immersed in liquids, such as chemical liquids, along with a plurality of wafers held in the wafer carrier 1. The bar code 12 of the wafer carrier 1 is steadily read out by a bar code reader arranged in the processing line of wafers; the information from the bar code 12 is used for succeeding processes, conveyance, storage, etc. and/or with the wafer carrier 1 contained in the wafer carrier box 2, the information from the bar code 14 is used for succeeding conveyance, transportation and the like.

As described above, writing the bar codes 12 and 14 directly on the side wall 11 of the wafer carrier 1 and the side wall 13 of the wafer carrier box 2 using a laser beam prevents the bar codes from coming away and from becoming a dust source, contrary to the conventional manner that papers on which each of the bar codes 12 and 14 is printed are applied on the wafer carrier 1 and wafer carrier box 2.

Besides, the bar codes 12 and 14 are baked by a laser, ink is not used, which avoids not only impurities from coming out but also deterioration of the identification capability of the bar codes 12 and 14 in the conventional manner, the deterioration in identification capability frequently occurs by running and blurring of the bar codes. Hence, it is possible for the wafer carrier 1 and wafer carrier box 2 to function fully for all their lives. Furthermore, since there is no need for removing the bar codes 12 and 14, there are no worries concerning mistakes in recognition of lots and the damage of bar codes.

All of these advantages will lead to smoother operations involving conveying, storing, and processing the wafers. Additionally, using the bar codes enables the use of an existing bar code reader, thus offering reduced cost, efficient processing and others advantages.

Incidentally, although the above embodiment has been referred to a one-dimensional bar code whose recorded information is read out by detecting in turn widths of longitudinal lines across them, it is possible to adopt a two-dimensional bar code in which required information is recorded by selectively painting a plurality of areas sectioned in both longitudinal and lateral directions. The two-dimensional bar code can be read at higher speeds, thereby increasing largely the processing speed of the wafer carrier 1 etc. Further, even when changed in size, but keeping the same bar code pattern, the two-dimensional bar code is still usable to read its recorded information, which makes it possible to form the two-dimensional bar code in a small space on a side wall etc. of objects. In order to read such two-dimensional bar code, a scanner (is used, such as the VERISCAN 1000 (trade name) manufactured by VERITEC Inc., U.S.A. Its code pattern can be optically read out and, the read image then processed by an image processor.

Further, though the bar codes 12 and 14 in the above embodiment have been applied on the side wall 11 of the wafer carrier 1 and the side wall 13 of the wafer carrier box 2, the bar code may be applied on any place where a laser system is able to write it in and a bar code reader is able to read it out.

Furthermore, above embodiment has adopted the technique of writing the bar code 12 of the wafer carrier 1 during the production of the wafer carrier 1. On the other hand, it is possible to arrange a laser system in the processing line of wafers and to write in processing histories each time according to each processing step for wafers. Similarly, for the wafer carrier box 2, it is possible to write in it in the course of conveyance etc.

The above embodiment has exemplified, as a resin-made basket for thin sheets, the wafer carrier 1 holding silicone wafers and the wafer carrier box 2 containing the wafer carrier 1 for production of semiconductors; while the same functions and advantages as the above may be given to cases where a container is used to contain and hold hard memory disks (magnetic disks) or compact disks (CDs) or a container to contain and hold thin sheets such as glass bases for LCD.

As further variations of materials, alloyed resin (i.e., alloyed polypropelene (PP) etc.) may be used for forming the wafer carrier 1 and wafer carrier box 2. Also, polymer-alloyed or metal-alloyed resin may be used.

As clearly shown from the above, in the resin-made basket for thin sheets of the present invention, a bar code for processing histories and control is directly written on the wall of a basket using a laser beam, thus avoiding a deterioration in identification capability of a bar code, which might caused by pure water or chemical liquids etc. in the conventional fashion, avoiding mistakes in recognition of lots and damages of bar codes, and improving conveyance, storage, processes, etc. of wafers.

Further, since the body of the basket is made up of polypropelene (PP) etc. containing 0.0001 to 0.5 percent by weight of Si, Ca, Ba, Na, K, C, Ti, Al or Mg as an exothermic body, the bar code can steadily be written in by a laser beam.

Even when a particular exothermic body is not included a catalytic substance functions also as an exothermic body, so that a bar code can be written by a laser beam.

Possibility of Utilization in Industry

As described above, a resin-made basket for thin-sheets according to the present invention is effective as a basket in which a plurality of thin sheets, such as base plates for hard memory disks (magnetic disks), compact disks (CDs), etc., silicone wafers for producing semiconductors, and glass bases for LCD, are contained and held together for operations including conveying, storing, and surface-processing the wafers.

We claim:

1. A resin-made basket for holding a plurality of thin sheets for operations including conveying, storing, and processing, the basket comprising:
a basket body-having an outer surface and being formed of resin material made up of any one of polyproylene(PP), polybutylene telephtalate(PBT), polycarbonate(PC), polyetherimide(-PEI), polyetheretherketone(PEEK), and polyester elastomer each containing a catalytic substance; and
a bar code having a white-black bar code pattern for processing histories and control the white-black bar code pattern being integrally formed as a part of the basket body on the outer surface by radiating a laser beam onto the outer surface along the bar code pattern.

2. The resin-made basket according to claim 1, wherein said catalytic substance is added in producing the resin-made basket.

3. The resin-made basket according to claim 2, wherein said white-black bar code pattern is a one-dimensional bar code pattern.

4. The resin-made basket according to claim 2, wherein said white-black bar code pattern is a two-dimensional bar code pattern.

5. The resin-made basket according to claim 1, wherein said resin material contains an exothermic body added in producing the resin-made basket.

6. The resin-made basket according to claim 5, wherein said exothermic body is any one of Si, Ca, Ba, Na, K, C, Ti, Al and Mg and comprises 0.0001 to 0.5 percent by weight of said basket body.

7. The resin-made basket according to claim 6, wherein said white-black bar code pattern is a one-dimensional bar code pattern.

8. The resin-made basket according to claim 6, wherein said white-black bar code pattern is a two-dimensional bar code pattern.

9. The resin-made basket according to claim 1, wherein said basket body is formed as a thin-sheet carrier having a first side wall partly composing the outer surface and an opening at an upper side of the thin-sheet carrier for taking in and out the thin sheets therein and therefrom and a thin-sheet carrier box having a second side wall partly composing the outer surface and an opening at a side of the thin-sheet carrier box for taking in and out the thin-sheet carrier therein and therefrom, said bar code being formed on outer sides of the first and second side walls.

10. The resin-made basket according to claim 9, wherein said resin material contains an exothermic body added in producing the resin-made basket.

11. The resin-made basket according to claim 10, wherein said exothermic body is any one of Si, Ca, Ba, Na, K, C, Ti, Al and Mg and comprises 0.0001 to 0.5 percent by weight of said basket body.

12. The resin-made basket according to claim 11, wherein said white-black bar code pattern is a one-dimensional bar code pattern.

13. The resin-made basket according to claim 11, wherein said white-black bar code pattern is a two-dimensional bar code pattern.

* * * * *